United States Patent [19]

Wu et al.

[11] Patent Number: 5,280,428
[45] Date of Patent: Jan. 18, 1994

[54] METHOD AND APPARATUS FOR PROJECTING DIAGNOSTIC IMAGES FROM VOLUMED DIAGNOSTIC DATA ACCESSED IN DATA TUBES

[75] Inventors: Shang Y. Wu, Waukesha; Philip M. Allen, Oconomowoc; Thomas E. Kennedy, Whitefish Bay; Robert F. Lloyd, Muskego; Christopher J. Wilbricht, Madison, all of Wis.

[73] Assignee: General Electric Company, Milwaukee, Wis.

[21] Appl. No.: 914,175

[22] Filed: Jul. 14, 1992

[51] Int. Cl.$^5$ .............. G06F 15/00; G01T 1/166; A61B 5/05
[52] U.S. Cl. .............. 364/413.13; 364/413.22; 128/653.2; 250/363.04
[58] Field of Search .............. 364/413.13, 413.15, 364/413.21, 413.22; 128/653.2, 653.05; 250/363.04

[56] References Cited

U.S. PATENT DOCUMENTS

| | | | |
|---|---|---|---|
| 4,985,534 | 1/1991 | Cline et al. | 364/413.22 |
| 5,008,822 | 4/1991 | Brunnet et al. | 364/413.21 |
| 5,079,699 | 1/1992 | Tuy et al. | 364/413.22 |
| 5,159,550 | 10/1992 | Sakamoto et al. | 364/413.13 |

*Primary Examiner*—Roy N. Envall, Jr.
*Assistant Examiner*—Khai Tran
*Attorney, Agent, or Firm*—Quarles & Brady

[57] ABSTRACT

A computer program for manipulating diagnostic images obtained with computed tomography or magnetic resonance systems stores acquired voxel data in addresses in an electronic memory related to the spatial location of the voxels. Sample lines are identified in the space of the voxels and interpolated values are determined for points along these sample lines by accessing the volume data in the electronic memory as a "tube" which includes voxel data having spatial coordinates which vary only in the dimension of the sample line. The tube of data may be more easily accessed from the electronic memory than would a series of random accesses and also allows the sharing of interpolation calculations for the interpolated points along the sample lines.

8 Claims, 7 Drawing Sheets

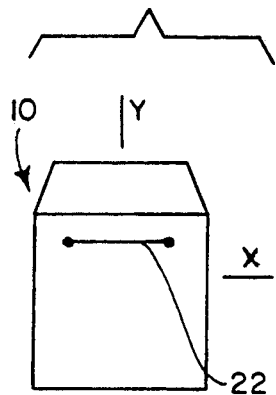
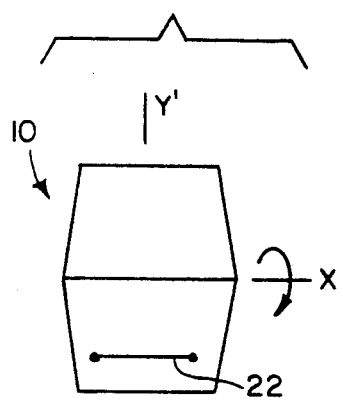
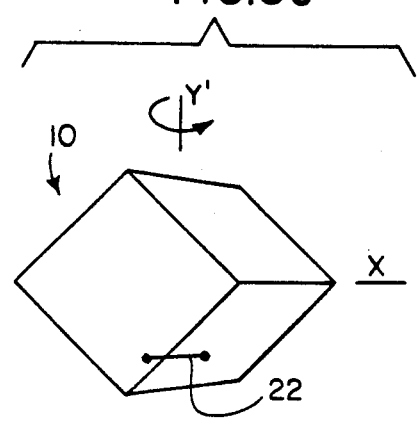
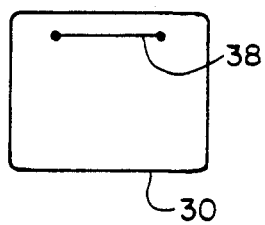
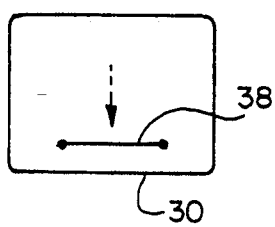
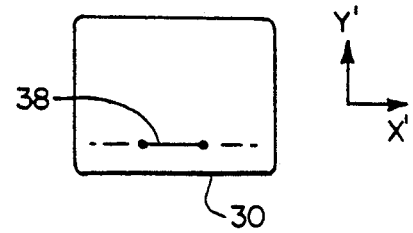
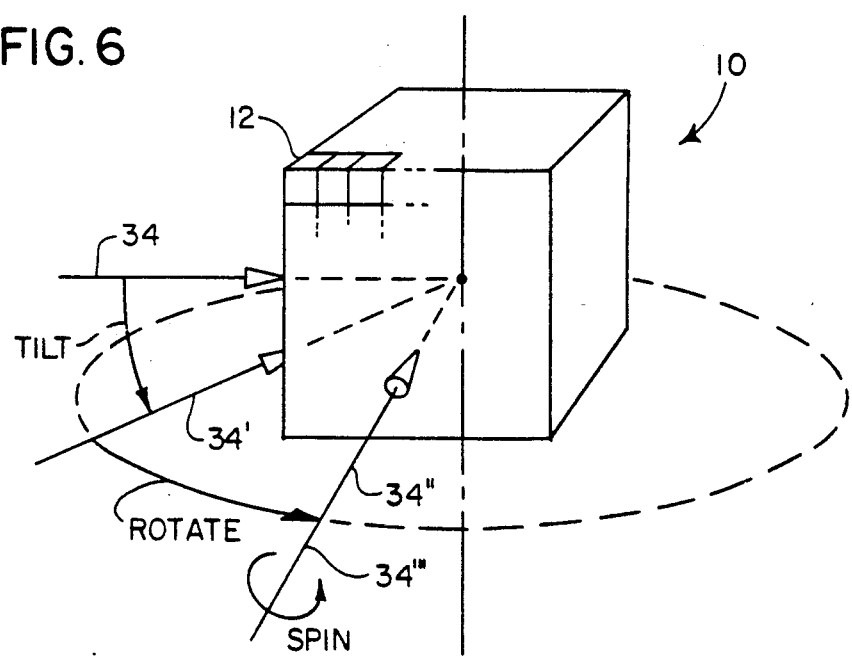

METHOD AND APPARATUS FOR PROJECTING DIAGNOSTIC IMAGES FROM VOLUMED DIAGNOSTIC DATA ACCESSED IN DATA TUBES

BACKGROUND OF THE INVENTION

1. Field of the Invention

This invention relates to a method and apparatus for generating images from physiological data acquired at multiple points in a volume. In particular, the invention relates to a method of generating images, the method accommodating the physical constraints of conventional computer hardware so as to increase the speed with which diagnostic images may be transformed and displayed.

2. Background Art

Advances in technology have provided the medical practitioner with a variety of medical imaging systems. One important class of medical imaging systems works by radiating energy through a region of interest in the body, either from an external source, such as x-rays or an RF field, or from an internal source, such as an injected radioisotope. The interaction of the radiated energy with the body is measured at a variety of small volume elements ("voxels") within the body. The spatial coordinates of each of these voxels are identified and a map of the body within that region of interest is developed.

Two important types of medical imaging systems which provide such voxel data are Magnetic Resonance Imaging ("MRI") and X-ray Computed Tomography ("CT")

a. Magnetic Resonance Imaging

Any nucleus which possesses a magnetic moment attempts to align itself with the direction of the magnetic field in which it is located. In doing so, the nucleus precesses around this direction at a characteristic angular frequency (Larmor frequency) which is dependent on the strength of the magnetic field and on the properties of the specific nuclear species, i.e. the gyromagnetic constant $\gamma$ of the nucleus. Nuclei which exhibit this phenomenon are termed "spins".

When a substance such as human tissue is subjected to a uniform magnetic field, the individual magnetic moments of the spins in the tissue precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another.

If the tissue is subjected to an oscillating radio frequency magnetic field which is in the x-y plane and which is near the Larmor frequency, the net aligned moment, $M_z$, may be rotated, or "tipped", into the x-y plane to produce a net transverse magnetic moment $M_t$, rotating in the x-y plane at the Larmor frequency. The degree to which the net magnetic moment $M_z$ is tipped, and hence the magnitude of the net transverse magnetic moment $M_t$, depends primarily on the length of time and the magnitude of the applied excitation field.

The practical value of this phenomenon resides in the signal which is emitted by the excited spins after the excitation signal is terminated. In simple systems, the excited spins induce an oscillating sine wave signal in a receiving coil. The frequency of this signal is the Larmor frequency, and its initial amplitude is determined by the magnitude of the transverse magnetic moment.

The amplitude of the emission signal decays in an exponential fashion with time, t:

$$A = A_0 e^{-t/T^*_2} \tag{1}$$

The decay constant $1/T^*_2$) depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase, after removal of the excitation signal, in a perfectly homogeneous field.

Another important factor which contributes to the amplitude of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques is known which involves the application of one or more RF excitation pulses of varying magnitude, duration, and direction. The prior art is replete with excitation techniques that are designed to take advantage of particular NMR phenomena and which overcome particular problems in the NMR measurement process.

When utilizing NMR to produce images it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective x, y and z axes. By controlling the strength of these gradients during each NMR cycle, the spatial distribution of spin excitation can be controlled and the location of the resulting NMR signals can be identified.

Typically, the volume which is to be imaged (region of interest) is scanned by a sequence of NMR measurement cycles. The resulting set of received NMR signals are digitized and processed to reconstruct data indicating the physical properties of specific voxels within the imaged volume. The voxel data is stored in an array in memory so that the spatial coordinates of each voxel may be identified.

b. Computed X-Ray Tomography

In a computed tomography system, an x-ray source is collimated to form a fan beam with a defined fan beam angle. The fan beam is oriented to lie within the x-y plane of a Cartesian coordinate system, termed the "gantry plane", and is transmitted through an imaged object, such as human tissue, to an x-ray detector array oriented within the gantry plane.

The detector array is comprised of a set of detector elements each of which measures the intensity of transmitted radiation along a different ray projected from the x-ray source to the particular detector element. The intensity of the transmitted radiation is dependent on the attenuation of the x-ray beam along that ray by the tissue.

The x-ray source and detector array are rotated on a gantry within the gantry plane and around a center of rotation within the tissue so that the angle at which the fan beam axis intersects the tissue may be changed. At each gantry angle, a projection is acquired, comprised of the intensity signals from each detector element. The gantry is then rotated to a new angle and the process is repeated to collect a number of projections along a number of gantry angles to form a tomographic projection set.

The acquired tomographic projection sets are typically stored in numerical form for later computer processing to "reconstruct" a slice image according to reconstruction algorithms known in the art. The reconstruction process converts the data of the rays, which represents total attenuation along the lines of the rays, to voxel data which represents the incremental x-ray attenuation provided by a voxel within the scanned area.

A typical computed tomographic study involves the acquisition of a series of "slices" of the imaged tissue, each slice parallel to the gantry plane and having a slice thickness dictated by the width of the detector array, the size of the focal spot, the collimation and the geometry of the system. Each successive slice is displaced incrementally along a z-axis, perpendicular to the x and y axes, so as to provide a third spatial dimension of information. After reconstruction, voxel data over a volume of the patient is obtained.

c. The Display of Voxel Data

As noted above, each of these imaging systems employs energy radiated through a region of interest of the body and detects the interaction of the energy with the body to acquire data at a plurality of voxels. The type of radiated energy is different for different imaging systems. The radiated energy is x-rays in the case of computed tomography (CT) and a radio frequency magnetic field in the case of nuclear magnetic resonance imaging (MRI). The energy is sound waves, in the case of ultrasound and high energy particles from an injected radioisotope, in the case of nuclear medicine or PET scanning. In each case voxel data is obtained over a volume.

The processing and display of the voxel data produced by the above systems present two problems. The first problem is simply the large amount of data that is acquired: a typical study may generate data for over 4,000,000 voxels. Efficient processing of this data is essential if the technology is to be practically useable.

The second problem is the need to present the voxel data in a meaningful way. The data is unintelligible when represented as numerals alone, so typically, each voxel value is projected to a brightness value of a picture element("pixel") on an image plane. The pixels of the image plane together produce a picture-like image. The image may be more easily understood to a human operator.

Projecting the voxels of the three dimensional volume to the pixels of a two dimensional picture requires discarding some voxel information. Ideally, however, an appropriately selected image plane will capture most of the diagnostically significant information. Alternatively, several image planes may be generated, and viewed, sequentially. In this latter case, just as one may comprehend the three dimensions of a statue by viewing it from various angles, the multiple projections allow one to gain a more complete understanding of the voxel data.

In both cases, it is critical that the orientation of the image plane be freely selected, easily adjusted and that new images be rapidly generated. This allows the ideal image plane to be determined on an interactive basis, or permits the quick shifting between different image planes necessary to visualize the three dimensions of the data.

For the projection of high resolution images, it is known to employ a ray tracing technique in which a series of rays are generated normal to the imaging plane and spaced to correspond with the spacing of each pixel in the desired image. For each ray, the ray's path through the imaging space is calculated and the voxel having spatial locations closest to the ray read from the computer memory. This voxel data is used to generate interpolated values at points lying on each ray. These interpolated values are combined to generate the value for the particular pixel associated with that ray. This method requires the reading of large amounts of voxel data at random memory addresses and an unwieldy number of interpolations and is therefore unacceptably slow when used to process the large amounts of voxel data associated with typical medical imaging systems. Ideally, one should be able to rotate and project medical imaging voxel data on a near "real-time" basis much as one might rotate a physical object within one's hands.

SUMMARY OF THE INVENTION

The present invention significantly increases the speed with which large arrays of voxel data may be rotated and projected to an image, thereby improving the ability of a human operator to understand and use such data.

Specifically, after voxel data is acquired in three dimensions, defined by an x, y and z coordinate, a desired view axis is determined. The view axis is defined by two rotative coordinates, tilt and rotate, about an x and y axis, and by one rotative coordinate, spin about the z-axis. From the view axis a projection axis is generated, embodying the rotate and tilt rotative coordinates only. Sampling lines, through the voxel data, are identified, spaced along rays parallel to the projection axis.

The acquired voxel data is stored in computer memory at first addresses related to spatial coordinates of the voxels. For processing, the data of the voxels is accessed as a "tube", the tube including a number of voxel data having addresses corresponding to spatial coordinates lying along tube edges of constant z and y values. Generally, each data tube is bounded by four tube edges. Sample values are interpolated at sample points among data of the tube at intervals along the sampling lines within each data tube.

The interpolated sample points are then projected along the projection axis to image values having image coordinates. The image values are stored at second addresses in the electronic memory, wherein the second addresses are related to image coordinates of the image values.

It is one object of the invention to allow accurate and rapid projection of large arrays of voxel data from medical imaging systems to an image, using present computer hardware. Processing the voxel data as grouped in data tubes allows more rapid memory access, by caching techniques and the like, because the data is read from blocks of adjacent memory addresses. The selection of the sampling lines based on tilting and rotation without spin, ensures that the sample points of each data tube will map to a single row of the image. This speeds the writing of image data.

Incident to the rotation of the array, the coordinates of each rotated voxel will no longer map regularly to pixels of the image. For high resolution images, new interpolated data, at sample points, must be generated prior to projection of the voxel data to pixels. The reading of voxel data in the form of a data tube allows each such interpolation to share calculations from previous interpolations, thus speeding this interpolation process.

The voxel data may be pre-processed by defining a subset of the voxel data within a volume of interest; the volume of interest ("VOI") is reflected as limits at either end of each data tube.

It is thus another object of the invention to provide a method of projecting image data from a volume of voxel data that realizes an improvement in speed when an image comprising less than all the voxel data is desired. Once the data tube is selected, only a single test must be performed to identify that data that is within the VOI. In contrast, were the voxel data read in a random access, as is required in a conventional ray-tracing projection, each voxel accessed would need to be tested against six limits.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made, therefore, to the claims herein for interpreting the scope of the invention.

BRIEF DESCRIPTION OF THE DRAWINGS

FIGS. 5(a)-(c) are perspective views of one row of voxels in a volume array and the projection of that row to a row of the image plane after rotation and tilting;

FIG. 6 is a perspective view of an array of voxels showing tilt and rotation of a view axis to provide the same effect as tilting and rotating the array;

DETAILED DESCRIPTION OF THE PREFERRED EMBODIMENT

1. Medical Imaging Equipment a. Magnetic Resonance Imaging

Figure 1:
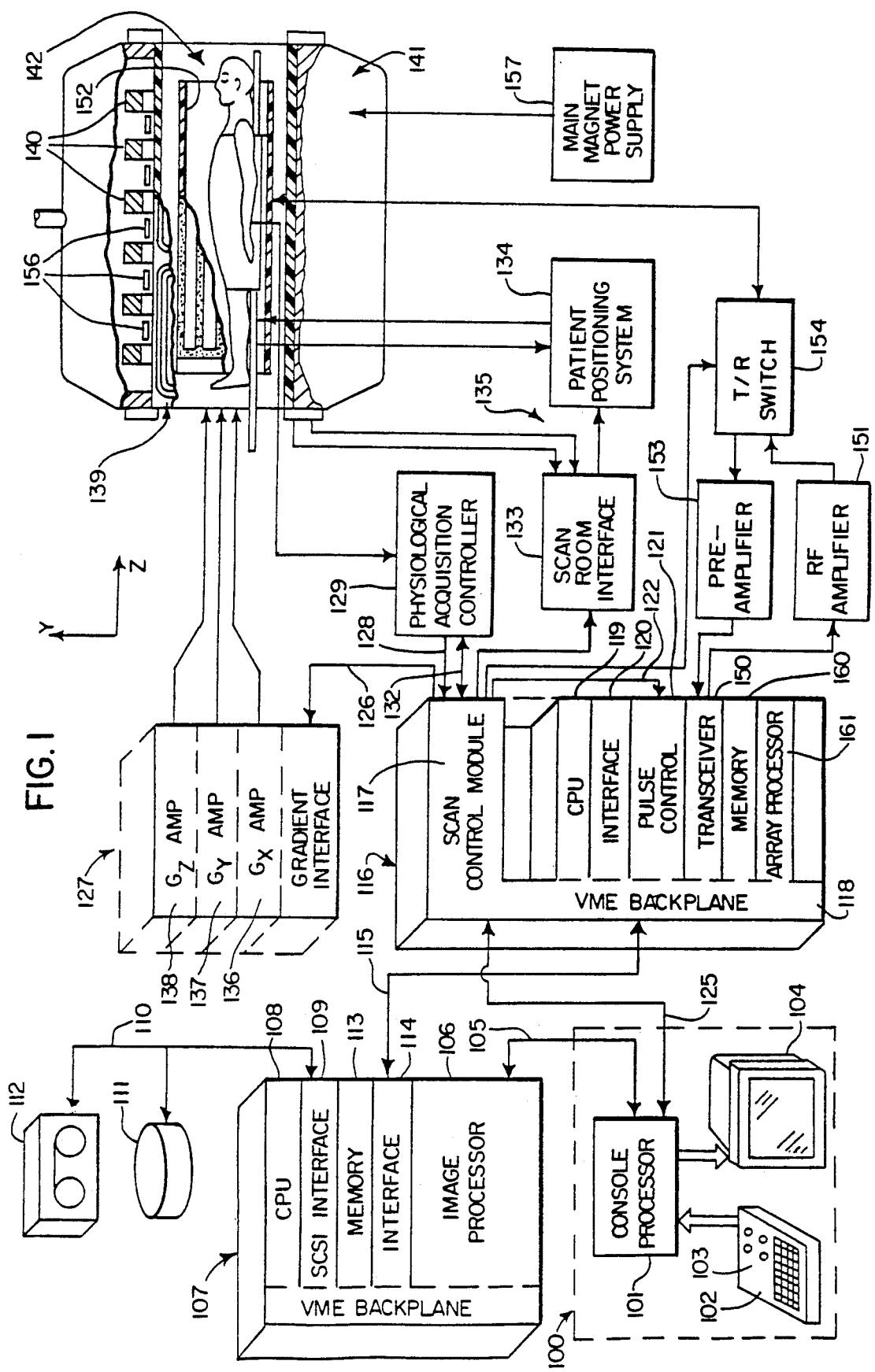
FIG. 1 is a block diagram of an NMR system as may be used with the present invention.

Referring first to FIG. 1, there are shown the major components of a preferred NMR system which incorporate the present invention and which is sold by the General Electric Company under the trademark "SIGNA". The operation of the system is controlled from an operator console 100 which includes a console processor 101 that scans a keyboard 102 and receives inputs from a human operator through a control panel 103. The console processor 101 also drives a video display 104 to produce images. The data for these images is received through a serial link 105 from an image processor 106 that forms part of a separate computer system 107.

The computer system 107 is formed about a backplane bus which conforms with the VME standards Versa Module Eurocard), and it includes a number of modules which communicate with each other through this backplane. In addition to the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113 for storing voxel data arrays, and a serial interface module 114 that links the computer system 107 through a high speed serial link 115 to a system control 116.

The system control 116 includes a scan control module 117 and a series of modules which are connected together by a common backplane 118. The backplane 118 conforms to the VME standards and it is controlled by a CPU module 119. A serial interface module 120 connects this backplane 118 to the high speed serial link 115, and a pulse control module 121 connects the backplane 118 to the scan control module 117 through a link 122. The scan control module 117 is also connected to the operator console 100 through a serial link 125, and it is through this link that the system control 116 receives commands from the operator which indicate the scan sequence that is to be performed.

The scan control module 117 operates the system components to carry out the desired scan sequence. It conveys data to the pulse control module 121 which indicates the timing, strength and shape of the RF pulses which are to be produced, and the timing and length of the data acquisition. The scan control module 117 also connects through serial link 126 to a set of gradient amplifiers 127, and it conveys data thereto which indicates the timing and shape of the gradient pulses that are to be produced during the scan. The scan control module 117 also receives patient data through a serial link 128 from a physiological acquisition controller 129. The physiological acquisition controller 129 can receive a signal from a number of different sensors connected to the patient. For example, it may receive ECG signals from electrodes or respiratory signals from a bellows and produce pulses for the scan control module 117 that synchronize the scan with the patient's cardiac cycle or respiratory cycle. And finally, the scan control module 117 connects through a serial link 132 to a scan room interface circuit 133 which receives signals at inputs 135 from various sensors associated with the position and condition of the patient and the magnet system. It is through the scan room interface circuit 133 that a patient positioning system 134 receives commands which move the patient cradle and transport the patient to the desired position for the scan.

The gradient waveforms produced by the scan control module 117 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly, generally designated 139. The gradient coil assembly 139 forms part of a magnet assembly 141 which includes a polarizing magnet 140 that produces a 1.5 Tesla polarizing field that extends horizontally through a bore 142. The gradient coils 139 encircle the bore 142, and when energized, generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_O$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 155 is given by $B(x,y,z) = B_O + G_x x + G_y y + G_z z$. The gradient magnetic fields are utilized to encode spatial information into the NMR signals emanating from the patient being studied.

Located within the bore 142 is a circular cylindrical whole-body RF coil 152. This coil 152 produces a transverse RF field in response to RF pulses provided by a transceiver module 150 in the system control cabinet 116. These pulses are amplified by an RF amplifier 151 and coupled to the RF coil 152 by a transmit/receive switch 154. Waveforms and control signals are provided by the pulse control module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the scan control module 117 to electrically connect the RF amplifier 151 to the coil 152 during the transmit mode and to connect the preamplifier 153 during the receive mode. The transmit/receive switch 154 also enables a separate RF coil (not shown) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. In the case of a resistive magnet, a main power supply 157 is utilized to continuously energize the magnet 140, and in the case of a superconductive magnet, the main power supply 157 is utilized to bring the polarizing field produced by the magnet 140 to the proper operating strength and is then disconnected. In the case of a permanent magnet, power supply 157 is not needed.

The received NMR signal is at or around the Larmor frequency, which in the preferred embodiment, is around 63.86 MHz. This high frequency signal is demodulated in transceiver 150. The resulting demodulated NMR signal has a bandwidth of 125 kHz and it is centered at a frequency of 187.5 kHz. The demodulated NMR signal is digitized by an analog-to-digital (A/D) converter, also in transceiver 150, and the output of the A/D converter is applied to a digital quadrature detector in the transceiver 150 which produces 16-bit in-phase (I) values and 16-bit quadrature (Q) values corresponding to the received digital signal. The resulting stream of digitized I and Q values of the received NMR signal is output through backplane 118 to the memory module 160 where it is employed to reconstruct an image according to reconstruction techniques known in the art.

The NMR signals picked up by the RF coil 152 are digitized by the transceiver module 150 and transferred to a memory module 160 which is also part of the system control 116. When the scan is completed and an entire array of data has been acquired in the memory modules 160, an array processor 161 operates to Fourier transform the data into an array of voxel data. This voxel data is conveyed through the serial link 115 to the computer system 107 where it is stored in memory module 113. In response to commands received from the operator console 110, this voxel data may be stored for later use in the disk memory 111, or archived on the tape drive 112. It may be further processed by the image processor 106, or it may be conveyed to the operator console 100 and presented on the video display 104.

The voxel data is stored in memory module 113 at addresses related to the spatial coordinates of the voxel of the voxel data. Hence, only the value of the voxel data need be explicitly stored; the spatial coordinates are implicit from the address of the imaged data in the memory of memory module 113.

b. Computed X-Ray Tomography

Figure 2:
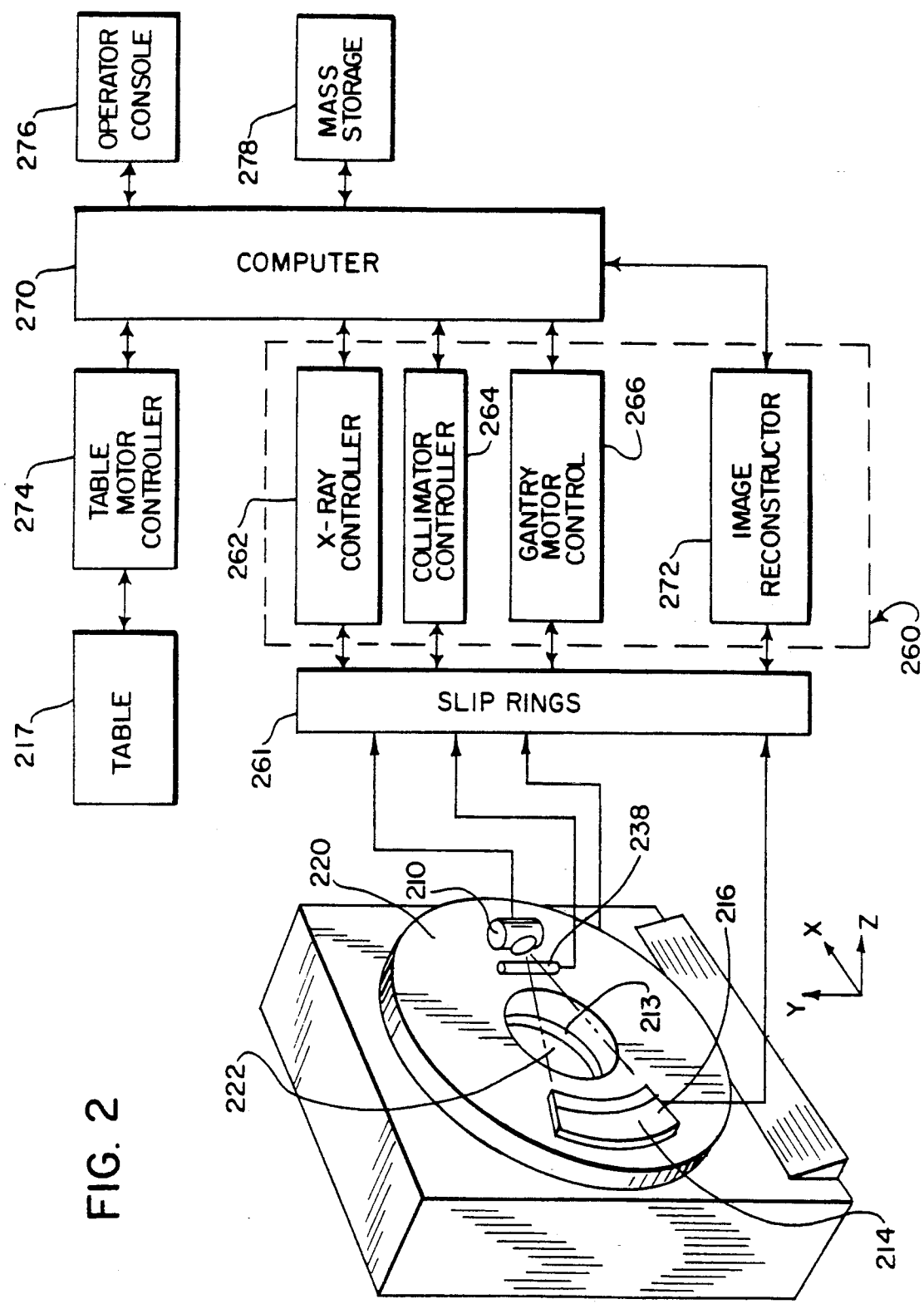
FIG. 2 is a schematic representation CT system as may be used with the present invention.

Referring to FIG. 2, a gantry 220, such as may be used in a "third generation" computed tomography (CT) scanner, includes an x-ray source 210 collimated by collimator 238 to project a fan beam of x-rays 222 through an imaged object (not shown) to detector array 214. The x-ray source 210 and detector array 214 rotate on the gantry 220 about a center of rotation 213. The rotation of the gantry 220 is within a gantry plane aligned with the x-y plane of a Cartesian coordinate system.

The patient rests on table 217 which is radio-translucent so as not to interfere with the imaging process. Table 217 may be controlled so that its upper surface translates along the z axis perpendicular to the x-y imaging plane, moving the imaged object across the gantry plane.

The detector array 214 is comprised of a number of detector elements 216, organized within the gantry plane, which together detect the projected image produced by the attenuated transmission of x-rays through the patient.

The x-ray source 210 includes an anode (not shown) positioned within an evacuated glass envelope. A stream of electrons from a cathode (not shown) is accelerated against the face of the anode to produce the x-ray beam 222. The production of x-rays may be controlled by x-ray controller 262.

The control system of a CT scanner, suitable for use with the present invention, has gantry-associated control modules 260 which include: x-ray controller 262 which provides power and timing signals to the x-ray source 210; collimator controller 264 which controls the positioning of the collimator 238; gantry motor controller 266 which controls the rotational speed and position of the gantry 220; and the image reconstructor 272 which receives projection data from the detector array 214 and process it to produce voxel data. The image reconstructor 272 may be an array processor such as is manufactured by Star Technologies of Virginia.

The gantry-associated control modules 260 communicate with the x-ray tube 210, collimator 238 and detector 214 via slip rings 261. It will be recognized that direct cabling using a take up reel may be substituted for the slip rings 261 for a limited gantry rotation system.

The x-ray controller 262, the collimator controller 264 and the gantry motor 266 controller are connected to a computer 270. The computer 270 is a general purpose minicomputer such as the Data General Eclipse MV/7800C and may be programmed to synchronize the rotation of the gantry 220 with the position of the fan beam 222.

The speed and position of table 217 along the z-axis is communicated to and controlled by computer 270 through table motor controller 274. The computer 270 receives commands and scanning parameters via operator console 276 which is generally a CRT display and keyboard which allows an operator to enter parameters for the scan and to display the reconstructed image and other information from the computer 270. A mass storage device 278 provides a means for storing operating programs for the CT imaging system, as well as voxel data for future reference by the operator.

2. Voxel and Pixel Data

The technologies of MRI imaging and CT imaging differ but they are similar in the respect that they both produce an array of voxel data of physical parameters at a large number of points over a volume within a patient. Importantly, each voxel is identifiable by spatial coordinates. MRI and CT imaging may be broadly classed, in this respect, with other medical imaging systems such as ultrasound and positron emission tomography "PET") which ultimately produce similar voxel data. Co-pending U.S. patent application Ser. No. 07/867,597, entitled: "Ultrasound Imaging System With Improved Dynamic Focusing, filed Apr. 13, 1992, and co-pending U.S. application Ser. No. 07/904,719 filed Jun. 26, 1992 entitled: "Gamma Ray Detector For PET Scanner", describe such systems. Both cases are assigned to the assignee of the present invention and are hereby incorporated by reference.

Figure 3:
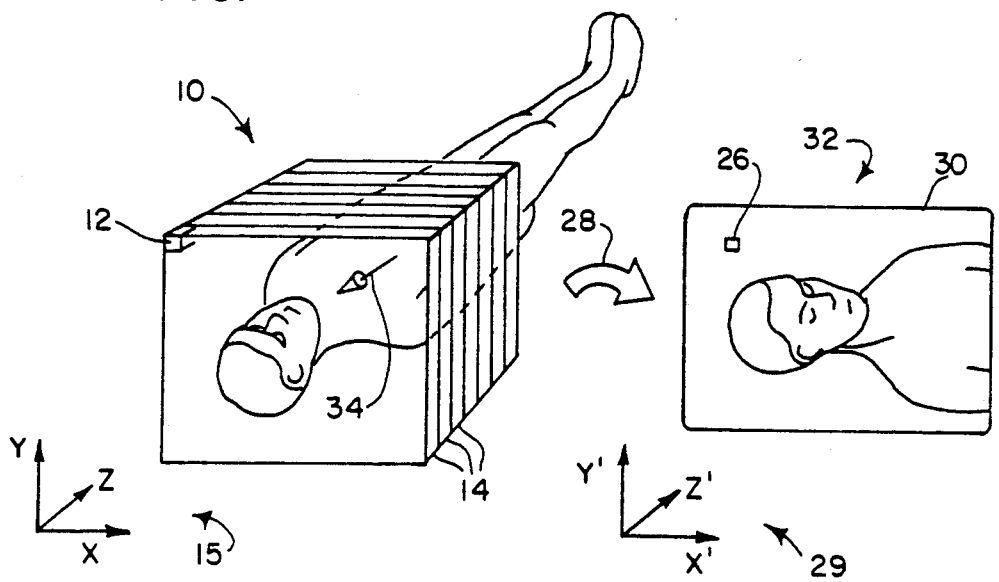
FIG. 3 is a pictorial representation of an imaged volume of voxel data as acquired and as projected to an image plane.

Referring now to FIG. 3, voxel data 13 produced by such systems is collected over an imaged volume 10 encompassing a volume of interest ("VOI") of the patient. Each voxel 12 encloses a portion of the imaged volume 10 and identifies the volume of tissue to which the voxel data 13 is related. The voxels 12 are identified to a spatial coordinate described by three values measured along the axes of a conventional Cartesian coordinate system. For simplicity, a voxel's spatial coordinate is defined as the location of the center of the voxel 12. Although only the voxels 12 have spatial coordinates, the voxel data 13 may be said to have coordinates, those coordinates being the coordinates of its associated voxel 12.

The orientation of the axes of the Cartesian coordinates is arbitrary, although ordinarily it is determined by the mechanics of the voxel acquisition. The spatial coordinates of the voxels 12 and their corresponding voxel data 13 will be termed the acquisition coordinates 15 and represented by the variables x, y, and z. Image coordinates 29 of x', y' and z' are defined with respect to the transformed and projected images which will be described below.

For simplicity, and in keeping with the orthogonal nature of the x, y and z axes of the Cartesian coordinate system, each voxel 12 is considered to be a simple rectangular prism. The size of each side of the voxel will ordinarily be defined by the limits of resolution of the imaging system. The voxels 12 fill the imaged volume 10 without gaps, in rectilinear columns 20 along the y-axis, and rows 22 along the x-axis, and slices 14 along the z-axis.

To simplify the storing of the voxel data 13 in computer memory 16, the latter which is addressed by sequential integer addresses, the units of the acquisition coordinates 15 and hence the spatial separation of the voxels 12 are normalized to the corresponding dimensions of the voxels 12 themselves so that the spatial coordinate of each voxel 12, for a given axis, changes by one as one moves to a next voxel 12 along that axis. The spatial coordinates for each voxel 12, therefore, may be integer values and hence more easily identified to particular integer addresses of the computer memory 16, as will now be described.

Figure 4:
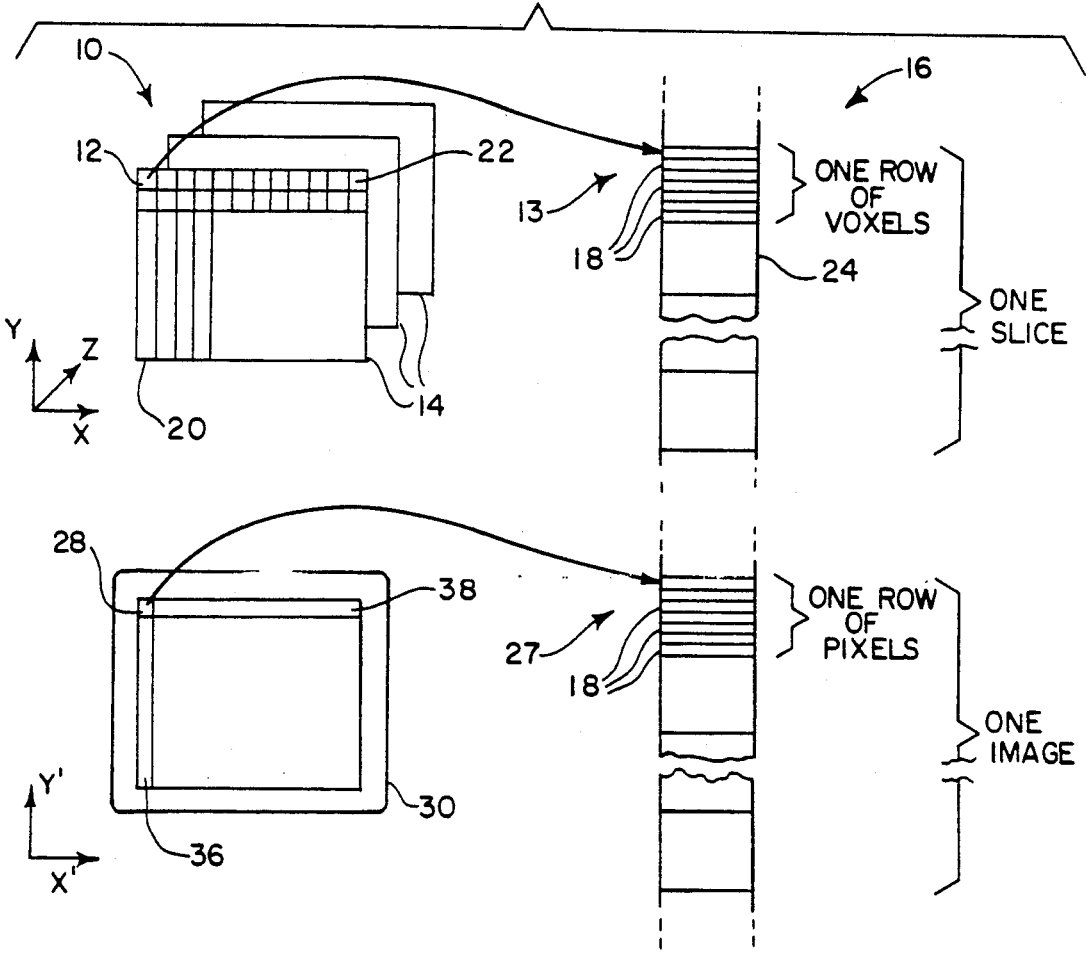
FIG. 4 is a schematic representation of the storage of rows of voxel and pixel data at sequential addresses in computer memory.

Referring to FIG. 4, the voxel data 13 of each voxel 12 of the imaged volume 10 is stored in memory 16, such as memory module 113 in the above described MRI system or memory associated with computer 270 of the above described CT machine. Memory 16 includes a plurality of words 18 each having a unique and sequentially numbered integer address.

Each word 18 of memory 16 holds the voxel data 13 for one voxel 12. The normalization of the units of the acquisition coordinates 15 allows the address of the particular word 18 to be used to indicate the spatial coordinates of the voxel 12. The voxels 12 are stored first by their order within a row 22, then according to their order in columns 20 and then according to their order in slices 14. The number of voxels in a row 22 is fixed and known, as is the number of columns 20 and slices 14, therefore, the spatial coordinates of the voxel 12 are easily calculated from the address of the voxel data 13 in computer memory 16, and vice versa.

As a result of this mapping of voxel data 13 to addresses of memory 16, the voxel data 13 of one row 22 of voxels 12 will be held in sequential words 18 of memory 16. The voxel data 13 of voxels 12 for a next row 22', adjacent to row 22, will be stored in words 18 forming a block 24 of memory 16 contiguous (in address) to the block storing the voxels 12 of row 22. Thus, to the extent possible, voxel data 13 for voxels 12 that are spatially proximate are stored in words 18 of memory 16 that are close in address.

Referring again to FIG. 3, in the present invention, the voxel data 13 associated with the imaged volume 10 will be converted to an image on a monitor 32. In this image, the voxel data 13 for selected voxels 12 are represented as a brightness or color of a picture element 26 ("pixel"). A pixel 26 will be typically the smallest unit of area in the image on the monitor 32 independently controllable in brightness or color. Pixels 26, in a manner analogous to voxels 12, are generally rectangular areas arranged contiguously over an image plane 30, of the image on monitor 32, in image coordinates 29 along rectilinear columns 36 along image axis x' and rows 38 along image axis y'. A third axis z' runs normal to the image plane 30.

Pixel data 27 indicating the brightness or color of each pixel is also stored in memory 16. As in the case with the voxels 12, the image coordinates x' and y' of the pixels 26 may be deduced from the address of the particular word 18 to be used to store the pixel data 27. The data of the pixels 26 are stored first by its order within the row 38, then according to order in columns 36. The number of pixels in a column 36 is fixed and known, as is the number of rows 38 and therefore, the image coordinates of the pixels 26 are easily calculated from the address of the pixel in computer memory 16, and vice versa.

Also, as with the voxels, a result of this mapping of pixels 26 to addresses of memory 16, is that the pixel data 27 of one row 38 of pixels 26 will be held in sequential words 18 of memory 16. Thus, pixel data 27 for pixels 26 that are spatially proximate are stored in words 18 of memory 16 that are close in address.

3. Transformation of Voxel Data to Pixel Data

The imaged volume 10 is three-dimensional but the image on the monitor 32 is two-dimensional. For this reason, the voxel data 13 must be projected, as indicated by arrow 28, to "compress" it to the two dimensions of the image. The process of projection 28 requires a selection of a view axis 34 which corresponds to a line-of-sight of a hypothetical viewer viewing the imaged volume 10 that will best exhibit the structure of interest in the patient. The view axis 34 is normal to the surface of the image plane 30 and parallel to the image axis z' when the image is displayed.

After the view axis 34 is selected, voxel data 13 of voxels 12 along the view axis is combined, according to one or more compression techniques, as will be described below, to produce the pixel data 27.

Referring now to FIG. 6 and FIG. 3, the location of the view axis 34 at an arbitrary orientation, or the movement of the view axis 34 to a new orientation, may be broken into a series of rotations—tilt, rotation, and spin—about orthogonal axes x', y', and z'. "Tilt" rotates the view axis 34 about the x' axis, "rotate" rotates the view axis 34 about the y' axis, and "spin" rotates the view axis 34 about the z' axis. Spin is also known as "clockwise/counterclockwise" in the art. The rotation axes x, y, and z are referenced to the view axis 34 which is always aligned with the z' axis.

In the present invention, movement of the view axis 34 is performed, effectively, in a two-step operation. First, the view axis 34 is first tilted and rotated, to produce a tilted view axis 34', and then a tilted and rotated view axis 34". Second, and only after the voxels 12 have been projected to pixels 26 (not shown in FIG. 6), the view axis 34" is spun to produce view axis 34'". This bifurcation of the rotational transformation of the view axis 34 speeds the reading and writing of the voxel data 13 from and to memory 16 and improves processing of the rotational transformation calculations on computer hardware.

Fundamental to the advantages of the bifurcation of the present invention is the fact that after only tilting and rotation, voxel data 13 from a row of voxels 12 will project to a row of pixels 26 within the image plane 30. This preservation of row to row mapping may be illustrated, referring to FIGS. 5(a)-5(c) by portraying the tilting, rotation and spinning of the view axis 34 as a tilting, rotation and spinning of the voxel data 13 of the voxels 12 about one or more of the three perpendicular viewing axes, x', y', or z'. The original, non-rotated imaged volume 10, shown in FIG. 5(a) includes a representative row 22 aligned with the x' axis. Prior to rotation, this row 22 projects to a line in the imaging plane 30 aligned with the x' axis. As shown in FIG. 5(b), after tilting of the imaged volume 10 about the x' axis, row 22 is displaced along the y' axis but does not rotate in the imaging plane 30. Similarly, and referring to FIG. 5(c), with rotation of the imaged volume 10 about the y' axis, the representative row 22, as projected to the imaging plane 30, becomes shorter but still does not rotate within the imaging plane 30. Thus after tilting and rotation, row 22 of voxels 12 maps to a row 38 in the image plane 30.

This row-to-row mapping will occur for any arbitrary row 22 of voxels 12 within the imaged volume 10 as may be established by referring to the product of matrices $M_r M_t$ (shown in equation (2) below) which may be used to effect the rotation and tilting only of the coordinates of the imaged volume 10 by matrix multiplication with an array of image coordinates [x, y, z].

$$M_r M_t = \begin{bmatrix} \cos(r) & \sin(r)\sin(t) & -\sin(r)\cos(t) \\ 0 & \cos(t) & \sin(r) \\ \sin(r) & -\cos(r)\sin(t) & \cos(r)\cos(t) \end{bmatrix} \quad (2)$$

Matrix sub-element column 2, row 1 is zero. As a result, changes in x (as one traverses a row 22) do not affect the ultimate value of the y' coordinate obtained by multiplying the acquisition coordinates 15 by the matrix (6).

Referring again to FIG. 4, it will be understood that the ability to read a single row in the imaged volume 10 and write to a single row of the imaging plane 30 permits accessing memory 16 efficiently in blocks of contiguous addresses ("contiguous memory"). The efficiency of accessing blocks of contiguous memory arises from the ability to use of memory caching systems where blocks are moved from slow storage devices such as off-chip random access memory 16 ("RAM") to faster on-chip RAM while the processor performs other tasks. Such caching systems, implicitly must predict the next address in memory 16 to be used, and are successful only when memory 16 is read or written to at consecutive and hence predictable addresses.

Figure 7:
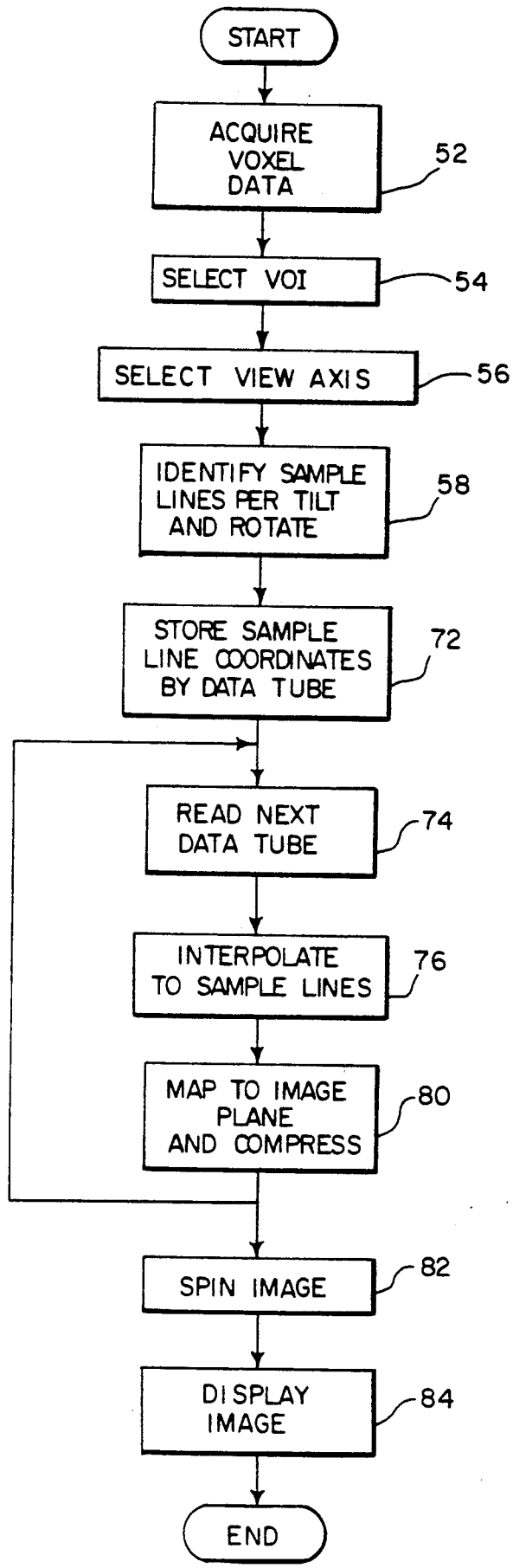
FIG. 7 is a flow chart depicting the method of the present invention and the accessing of the voxel data in data tubes.

Referring now to FIG. 7, the method of the present invention first acquires of voxel data 13 throughout the imaged volume 10 (shown in FIG. 3), at a variety of voxels 12, as indicated by process block 52. The acquisition of voxel data may be according to any number of medical imaging techniques such as MRI and CT imaging described above.

At process block 54, a volume of interest ("VOI") is designated, the VOI being a subset of the voxels of imaged volume 10, for example those voxels 12 clustered about a particular organ of a patient. The VOI is defined by a set of numerical coordinate limits along each of the axes x, y and z. Outside the range of these limits, voxel data 13 will not be processed. The values of these limits may be constant, in which case the VOI is a rectangular volume within the imaged volume 10, or the limits may be arbitrary functions of the other axis values. In the latter case, the limits are stored in computer memory 16 to be accessed according to the values of the other coordinate of the particular voxel. Typically, the VOI is designated by the human operator of the imaging equipment on an interactive basis, for example, by drawing outlines in planes defined by two of the three coordinate axes, with a cursor control device such as is well known in the art.

At process block 56, coordinates in terms of tilt, rotate, and spin are received from the operator to designate the desired view axis 34 along which the voxel data 13 of the imaging volume should be projected. These coordinates are typically selected with trial and error after review of the generated image for the selected coordinates.

In a typical ray tracing operation, the coordinates of the view axis would be used to generate a plurality of projection rays and the voxel data 13 with coordinates along these rays would be read from memory 16 in a series of individual random access operations and compiled. In contrast, in the present invention, voxel data is collected along sampling lines, and selected at process block 58, and the sampling lines are oblique to the projection rays.

Figure 9:
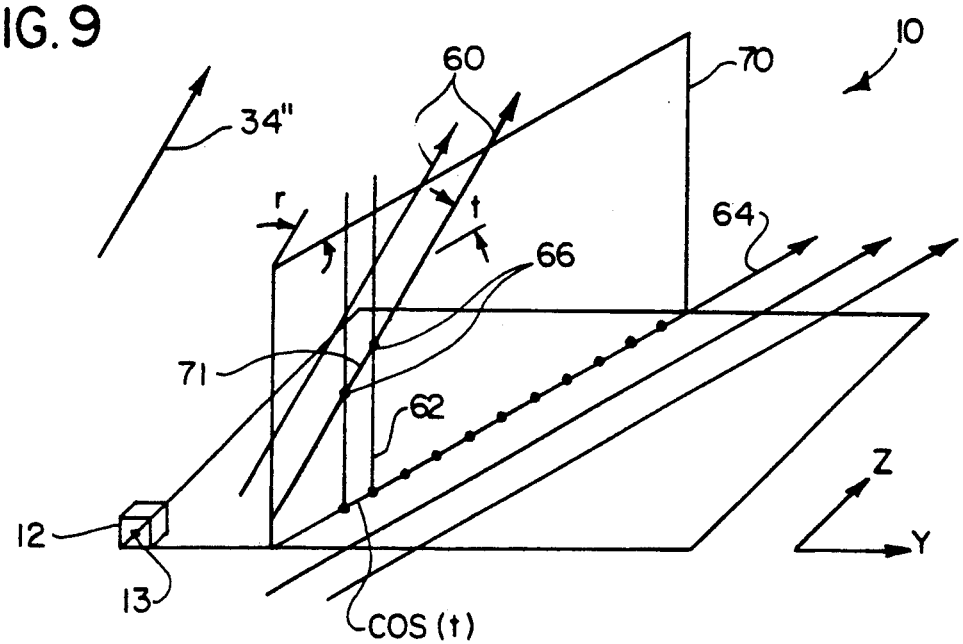
FIG. 9 is a perspective view of the sampling lines of FIG. 8 showing their interception of projection rays for projecting an image.

Referring to FIG. 9, projection rays 60, generally parallel to the view axis 34" (being the view axis 34 after only tilt and rotate), will be angled with respect to the x, y and z coordinates of the imaged volume 10 as a result of the arbitrary selection of the tilt, and rotate coordinates of the view axis 34. Sampling lines 62 intercepting the projection rays 60 and extend along the x axis of the imaging volume 10 with constant values of y and z.

Because the projection rays 60 are parallel to the view axis 34", they are angled only with tilt and rotate and therefore multiple projection rays 60 will be contained within an alignment plane 70 perpendicular to the y-z plane. As a result, all the projection rays 60 be will projected to a series of mutually parallel positioning lines 64 on the y-z plane. A sampling line 62 on one of the positioning lines 64 will intersect all the projection rays 60 within the corresponding alignment plane 70.

Sample points 66 are spaced along projection rays 60 at locations where voxel data must be interpolated to map to a particular pixel 26. The spacing of the sample points 66 along the projection rays is generally a unit distance 71 equal to the spacing between adjacent voxels 12. This spacing minimizes any degradation of the resolution of the image to be projected along the projection rays 60; a more compact spacing wastes computational effort, as the fundamental resolution of the imaged volume 10 cannot be increased, whereas a less compact spacing unnecessarily degrades the resolution of the voxel data.

Although the selection of the spacing of the sample points 66 is important, the absolute position of each sample point 66 along the projection rays 60 is essentially arbitrary. Accordingly, the sample points 66 on each projection ray 60 are shifted so that a single sampling line 62 can intersect a sample point 66 on each projection ray 60 in a given alignment plane 70.

Referring to FIG. 7, the position of the sampling lines 62 to intercept the sample points 66 on the projection rays 60 is now determined per process block 58.

Figure 8:
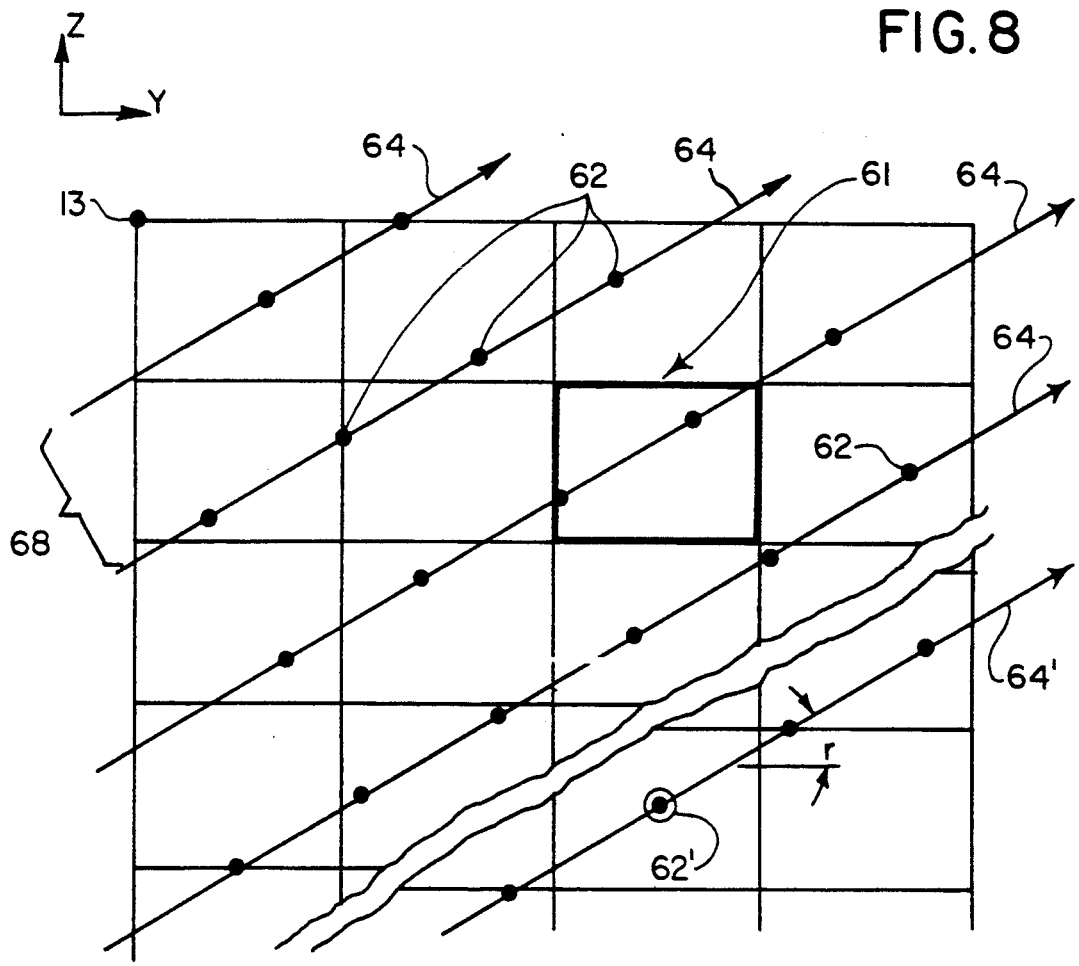
FIG. 8 is a view of the y-z plane of the imaged volume of FIG. 3 showing the positioning of sampling lines within a data tube of voxel data.

Referring to FIGS. 8 and 9, the location of a first sampling lines 62' is arbitrarily fixed in the center of the y-z plane. This in turn defines a first positioning line 64', through the sampling line 62' and at angle r with respect to the y axis. The first positioning line 64' defines a first alignment plane 70' (not shown).

The remaining positioning lines 64 are positioned parallel to and flanking the first positioning line 64' spaced apart from the initial positioning line 64' by a pixel's spacing 68. On each positioning line 64', other sampling lines 62 may be identified spaced from the initial sampling line 62' by cos(t) times the desired unit sampling distance 71 along each projection ray 60. As the projection rays 60 diverge from the y-z plane more steeply, the spacing of the sampling lines 62 along the positioning lines 64 will decrease.

For positioning lines 64 on either side of the initial positioning line 64' the first sampling line may be arbitrarily located. Each sampling line 62 is identified by a z and y coordinate.

Figure 10:
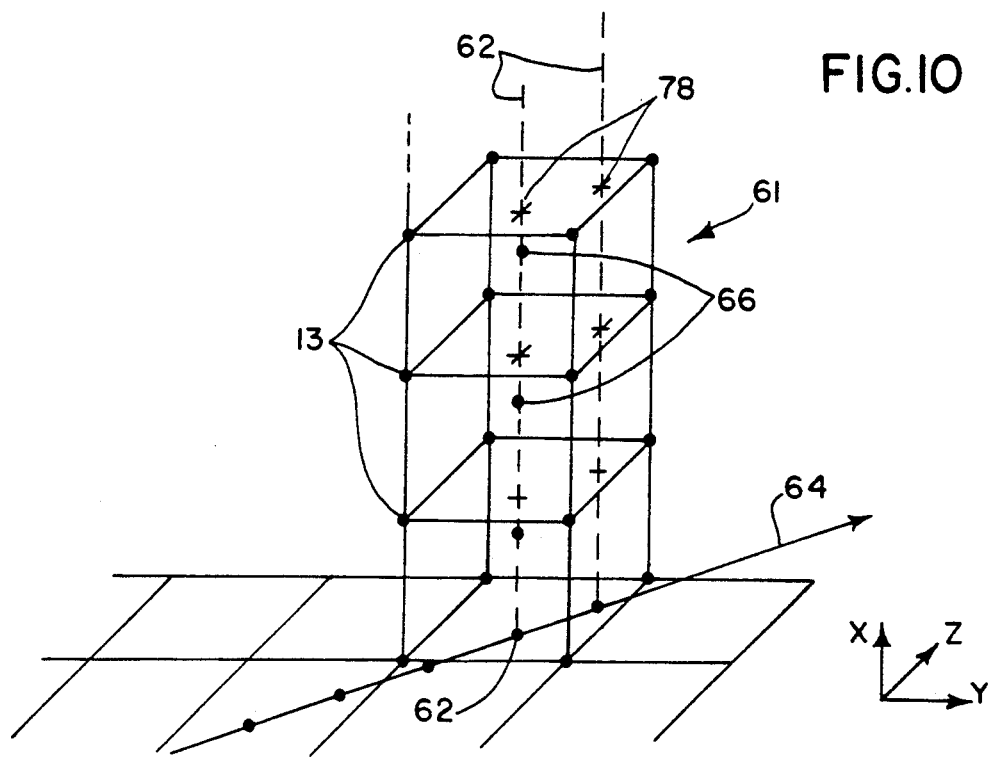
FIG. 10 is a perspective of a data tube of FIG. 8 showing the sampling lines within the data tube.

Referring to FIGS. 7, 8 and 10, at process block 72 the voxel data 13 of the voxels 12 may be grouped by its z and y coordinates into data tubes 61 having generally rectangular cross sections parallel to the y-z plane and extending along the x axis. The boundary of each data tube 61 is defined by edges of voxel data 13 along lines of constant z and y. The y and z coordinates of each edge differ from the other edges of the data tube 61 by one or zero.

All volume within the imaging array 10 is intercepted by at least one data tube 61; the tubes 61 fit together without gaps along the columns and slices of the imaged volume 10. And each voxel datum 13 may be part of as many as four data tubes.

A given sampling line 62 will fall within or at the edge of a single data tube 61 and the sampling lines are therefore cataloged in memory 16, at process block 58, by their encompassing data tube 61. This permits the sampling lines 62 within a given data tube 61 to be rapidly determined.

Referring to FIG. 7, after the identification of each sampling line 62 to a data tube 61, the voxel data 13 of a first data tube 61 is read from memory 16 as indicated by process block 74. Because the voxel data 13 of the edge of the data tube 61 has constant y and z coordinates and thus is held in a single row of voxel data 13, the voxel data 13 of the edge will be located in consecutive addresses of memory 16. As noted above, this permits much faster access of the voxel data 13 of the data tube 61 than would be obtained if the voxel data 13 were accessed randomly per conventional ray tracing techniques. Only the voxel data 13 within the VOI is acquired as determined by the limits established at process block 54.

At process block 76, and referring also to FIG. 10, the voxel data 13 at the four edges of the data tube 61 at a given x coordinate value are interpolated by bi-linear interpolation to intermediary sample points 78 on the sampling lines 62 within the volume of the data tube 61. The intermediary sample points 78 are typically not coincident with the sample points 66.

As discussed above with respect to FIGS. 5(a)–(c), each row 22 of voxel data 13 will map to a single row of image data 38. Accordingly, the intermediary sample points 78 on each sampling line 62 will also map to points within a single row 38 of pixel data 27 (shown in FIG. 4).

The particular row 38 of the image to which a row of voxel data 13 will map is readily identified by the positioning line 64 associated with the particular sampling line 62: the data associated with each positioning line 64 uniquely maps to a given row in the imaging plane. If the initially selected sampling line 62' is positioned in the center of the y-z plane of the imaged volume 10, then the sampling line 62' will always map to the center of the image plane 30 regardless of the tilting and rotation. The row 38 of the imaging plane 30 to which a sampling line 62 maps can be then determined by simply counting the number of positioning lines 64 from which the positioning line 64 associated with that sampling line 62 is spaced from the initial positioning line 64'. The row 38 will be an equivalent number of pixels displaced from the center of the imaging plane 30.

Referring to FIGS. 7 and 10, sample points 66 are interpolated along the sampling lines 62 from the intermediary sample points 78 at process block 80.

Figure 11:
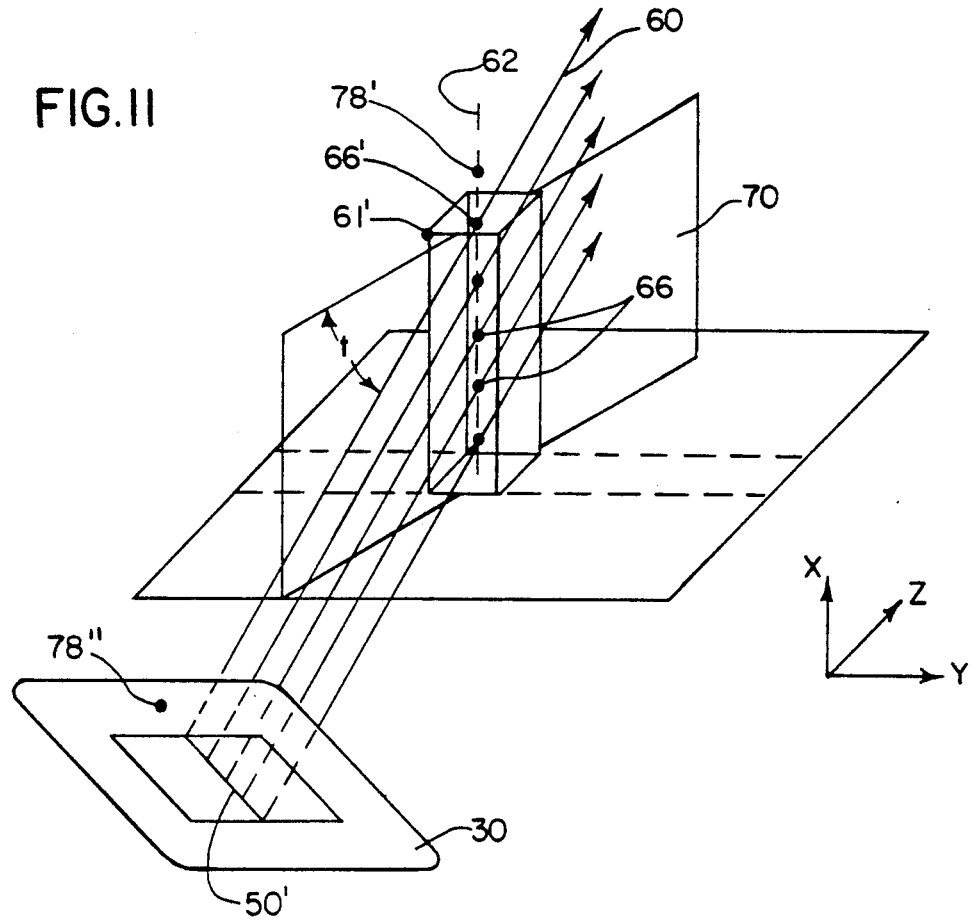
FIG. 11 is a perspective view of interpolated sample points along the sampling line as projected along projection rays to an imaging plane.

Referring now to FIG. 11, the sample points 66 may be identified along the sampling line 62 by projecting a single end intermediary sample point 78' of the sampling line 62 to the image plane 30 and then truncating the image space coordinates of the projected point 78" so that it lies on a pixel image coordinate, and then re-transforming that image coordinate back to the sampling line 62 to identify the x coordinate of a first sample point 66' on the sampling line 62. The other sample points 66 will be spaced from this sample point 66' by a distance equal to $$\frac{1}{\cos(t)}.$$

With the x locations of the sample points 66 on the sampling line 62 known, values for the sample points 66 may be linearly interpolated from the intermediary sample points 78.

For each data tube 61, values of sample points 66 are written to memory 16 for storage. As noted above, each sampling line 62 will map to a row of pixels and thus the accessing of the memory 16 for storage of the pixel data 27 will be facilitated.

Referring again to FIG. 7, during the mapping of the sample points to the image plane 30, indicated by process block 80, the data of the sample points 66 in three dimensions is compressed to the two dimensions of the image plane 30. Compression of sample points 66 along a projection ray 60 is known in the art and generally requires selecting among the sample points 66 along a particular ray aligned with a view axis 34". In the preferred embodiment, the compression method is chosen from those which are indifferent to distance that the sampled points are displaced along the projection ray 60, allowing that information to be ignored during the mapping, simplifying the storage requirements of the compression process. A number of compression techniques meet this requirement including that of finding the minimum or maximum value sample point 66 value along each projection ray 60 or computing a summation of all values of sample points 66 along a projection ray 60. The compression of process block 80 is performed by comparing each value of a given sample point 66 to the then current value of the pixel 26 at the indicated image coordinates. When the maximum value of sample points 66 is sought, the memory 16 for pixels 26 is initially loaded with a value lower than any possible value of a sample point 66. Each sample point 66 is then interpolated from the intermediate sample points and compared to the corresponding pixel data in memory 16. If the value of the sample point 66 is greater than the pixel datum, that sampled point value replaces the pixel datum.

Once all the data tubes 61 have been read at process block 74, the value at each pixel 26 will represent the highest valued sample point 66 along each projection ray 60.

After the compression of the data of the sample points 66 to pixels in the image plane 30, the pixels 26 are further transformed by spinning the image about the z' axis normal to the image plane 30 as indicated by process block 82. This separate step of spinning the pixels in process block 82, distinct from the effective rotation and tilting of the voxels 12 in the previous process blocks, adds little to the computational time needed for the construction of an image because typically there are far fewer pixels 26 than voxels 12. The additional burden of the separate spin step of process block 82 is more than made up for by the computational efficiencies gained by ensuring that rows of voxel data map to rows of image data as provided by the bifurcation of the transforming process.

In operation with present computer technology, the present invention can reduce the time taken to transform a 256 by 256 by 60 matrix of voxel data 13 represented by an MRI or CT scan to near real time speeds.

The image coordinates of the pixels 26 will not necessarily have integer values after the spin of process block 82. For example, a pixel having an image coordinates 1, 2 may rotate to a pixel 26 having spatial coordinates 1.2, 3.6. Accordingly, new values of pixel data are be interpolated at integer coordinates between the transformed coordinates.

At process block 84, a brightness or color value is assigned to the value of each of the pixels 26 for display on the monitor 32. The brightness may be in simple proportion to the value of the pixel data 27.

Many modifications and variations of the preferred embodiment which will still be within the spirit and scope of the invention will be apparent to those of ordinary skill in the art. In order to apprise the public of the various embodiments that may fall within the scope of the invention, the following claims are made.

I claim:

1. A method of generating a diagnostic image of a body comprising the steps of:

directing a radiated energy through a region of interest of the body;

detecting an interaction of the energy with the body. to acquire data at a plurality of voxels, the voxels having spatial coordinates in dimensions of a coordinate system of x, y, and z and being located within the region of interest wherein the data of each voxel corresponds to a physical property of the body at the spatial coordinates;

storing the voxel data in first addresses in an electronic memory wherein the addresses are related to spatial coordinates of the voxels;

determining a desired view axis along which to view the voxels, the desired viewing axis defined by two rotative coordinates, tilt and rotate, about the x and y axes, and by one rotative coordinate, spin, about the z-axis;

determining a projection axis defined by the rotate and tilt rotative coordinates only;

identifying sampling lines of constant y and z coordinates regularly spaced along rays parallel to the projection axis;

accessing a tube of voxel data from memory, the tube including a plurality of voxel data having addresses corresponding to spatial coordinates lying along tube edges of constant z and y values;

for each data tube interpolating sample values among data of the tube at intervals along sampling lines within the data tube;

projecting the interpolated sample values along the projection axis to image values having image coordinates;

storing the image values at second addresses in the electronic memory wherein the second addresses are related to image coordinates of the image values.

2. The method of claim 1 wherein the voxel data is x-ray attenuation data produced in a three-dimensional field by a computed tomography scanner.

3. The method of claim 1 wherein the voxel data is nuclear magnetic resonance data produced in a three-dimensional field by magnetic resonance imaging equipment.

4. The method of claim 1 including the additional step of transforming the image coordinates of the image values by the spin prior to storing the image values in the second memory addresses.

5. An apparatus generating a diagnostic image of a body comprising:

a means for directing a radiated energy through a region of interest of the body;

a means for detecting an interaction of the energy with the body to acquire data at a plurality of voxels, the voxels having spatial coordinates in dimensions of a coordinate system of x, y, and z and being located within the region of interest wherein the data of each voxel corresponds to a physical property of the body at the spatial coordinates;

an electronic memory for storing the voxel data in first addresses wherein the addresses are related to spatial coordinates of the voxels;

an input means for receiving a desired view axis along which to view the voxels, the desired viewing axis defined by two rotative coordinates, tilt and rotate, about the x and y axes, and by one rotative coordinate, spin, about the z-axis;

a means for producing a projection axis defined by the rotate and tilt rotative coordinates only;

a means for identifying sampling lines of constant y and z coordinates regularly spaced along rays parallel to the projection axis;

a means for accessing a tube of voxel data from the electronic memory, the tube including a plurality of voxel data having addresses corresponding to spatial coordinates lying along tube edges of constant z and y values;

a means for interpolating sample values, for each data tube, among data of the tube at intervals along sampling lines within the data tube;

a means for projecting the interpolated sample values along the projection axis to image values having image coordinates;

a means for storing the image values at second addresses in the electronic memory wherein the second addresses are related to image coordinates of the image values.

6. The apparatus of claim 5 wherein the directing means is an x-ray tube and wherein the detecting means is an array of x-ray detectors to provide voxel data related to the attenuation of the x-rays by the body.

7. The apparatus of claim 5 wherein the directing means is an RF coil for transmitting RF energy and the detecting means is an RF antenna for receiving NMR signals to provide voxel data related to the precessing of protons caused by the RF energy.

8. The apparatus of claim 5 wherein the storing means includes means for transforming the image coordinates of the image values by the spin prior to storing the image values in the second memory addresses.

* * * * *